United States Patent
Kim et al.

(10) Patent No.: US 8,736,077 B2
(45) Date of Patent: May 27, 2014

(54) SEMICONDUCTOR PACKAGE SUBSTRATE

(75) Inventors: Jong Man Kim, Gyunggi-do (KR); Young Hoon Kwak, Gyunggi-do (KR); Kyu Hwan Oh, Gyunggi-do (KR); Seog Moon Choi, Seoul (KR); Tae Hoon Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/308,441

(22) Filed: Nov. 30, 2011

(65) Prior Publication Data

US 2013/0037967 A1 Feb. 14, 2013

(30) Foreign Application Priority Data

Aug. 10, 2011 (KR) .................. 10-2011-0079672

(51) Int. Cl.
*H01L 23/488* (2006.01)

(52) U.S. Cl.
USPC ........... 257/783; 257/668; 257/675; 257/676; 257/706; 257/717; 257/782; 257/E23.006; 257/E23.052; 257/E23.08

(58) Field of Classification Search
USPC .............. 257/706, 717, 782, 783, E23.006, 257/E23.052, E23.08, 668, 675, 676, 257/E23.06
See application file for complete search history.

(56) References Cited

U.S. PATENT DOCUMENTS

| | | | | |
|---|---|---|---|---|
| 4,480,262 A | * | 10/1984 | Butt | 257/675 |
| 4,897,508 A | * | 1/1990 | Mahulikar et al. | 174/522 |
| 5,013,871 A | * | 5/1991 | Mahulikar et al. | 174/565 |
| 5,239,131 A | * | 8/1993 | Hoffman et al. | 174/538 |
| 6,081,038 A | * | 6/2000 | Murayama | 257/783 |
| 6,353,263 B1 | * | 3/2002 | Dotta et al. | 257/777 |
| 7,998,879 B2 | | 8/2011 | Lee | |
| 8,198,543 B2 | | 6/2012 | Kang | |
| 8,242,371 B2 | | 8/2012 | Shin | |
| 8,315,056 B2 | | 11/2012 | Lim | |
| 8,368,291 B2 | | 2/2013 | Seo | |
| 8,553,417 B2 | | 10/2013 | Park | |
| 8,603,842 B2 | | 12/2013 | Lim | |
| 2005/0085065 A1 | | 4/2005 | Mok | |
| 2006/0102383 A1 | | 5/2006 | Cha | |
| 2006/0163749 A1 | * | 7/2006 | Lee et al. | 257/778 |
| 2009/0121362 A1 | * | 5/2009 | Jang | 257/782 |

(Continued)

FOREIGN PATENT DOCUMENTS

| | | |
|---|---|---|
| JP | 11-354582 | 12/1999 |
| JP | 2007-081064 | 3/2007 |
| JP | 2009-170703 | 7/2009 |

OTHER PUBLICATIONS

Office Action from counterpart Korean Patent Application No. 10-2011-0079672, mailed Sep. 26, 2012, 4 pages, English Summary included.

(Continued)

*Primary Examiner* — Peniel M Gumedzoe
(74) *Attorney, Agent, or Firm* — Bracewell & Giuliani LLP; Brad Y. Chin

(57) ABSTRACT

Disclosed herein is a semiconductor package substrate including a base substrate, a mounting member mounted on an upper portion of the base substrate, and an adhesive layer formed between the base substrate and the mounting member, wherein the adhesive layer includes a thermally conductive adhesive and a ductile adhesive formed at the outer circumference of the thermally conductive adhesive.

10 Claims, 3 Drawing Sheets

(56) References Cited

U.S. PATENT DOCUMENTS

| | | |
|---|---|---|
| 2009/0277674 A1 | 11/2009 | Oh |
| 2010/0051329 A1 | 3/2010 | Kim |
| 2010/0097770 A1 | 4/2010 | Park |
| 2011/0260198 A1 | 10/2011 | Lee |
| 2011/0284382 A1 | 11/2011 | Park |
| 2011/0303437 A1 | 12/2011 | Lim |
| 2011/0303440 A1 | 12/2011 | Lim |
| 2011/0316035 A1 | 12/2011 | Shin |
| 2012/0000697 A1 | 1/2012 | Kang |
| 2012/0067623 A1 | 3/2012 | Park |
| 2012/0085574 A1 | 4/2012 | Park |
| 2012/0103588 A1 | 5/2012 | Kim |
| 2012/0103589 A1 | 5/2012 | Sohn |
| 2012/0111610 A1 | 5/2012 | Kim |
| 2012/0273116 A1 | 11/2012 | Sohn |
| 2012/0273558 A1 | 11/2012 | Shin |
| 2012/0306065 A1 * | 12/2012 | Bin Mohd Arshad ........ 257/676 |
| 2013/0020111 A1 | 1/2013 | Oh |

OTHER PUBLICATIONS

Office Action from counterpart Japanese Patent Application No. 2011-247516, mailed Oct. 1, 2013, 6 pages, English Summary included.

* cited by examiner

SEMICONDUCTOR PACKAGE SUBSTRATE

CROSS REFERENCE TO RELATED APPLICATION

This application claims the benefit of Korean Patent Application No. 10-2011-0079672, filed on Aug. 10, 2011, entitled "Semiconductor Package Substrate", which is hereby incorporated by reference in its entirety into this application.

BACKGROUND OF THE INVENTION

1. Technical Field

The present invention relates to a semiconductor package substrate.

2. Description of the Prior Art

As home appliances such as a refrigerator, a washing machine, an air-conditioner, and the like, become more prevalent, demand for various types of semiconductor device modules included in home appliances has also been increased. For example, among the semiconductor device modules included in home appliances is an inverter board. A power module used in the inverter board is a core part for controlling power or driving a motor, which controls power of a motor for controlling driving of the motor in the inverter board. The power module is a high value-added electronic component due to having marketability because it is used for industrial purposes as well as for household use. To ensure high reliability of an electronic product, the reliability of the power module is crucial. To ensure high reliability of the power module, a chip constituting the power module and a semiconductor package substrate on which the chip is mounted is required to have a stable structure. However, in a semiconductor package process for mounting a chip and testing reliability thereof, when the semiconductor package is exposed to high temperature, an interlayer crack may be generated in the semiconductor package substrate and warpage of the semiconductor package substrate due to the difference in a thermal expansion coefficient between layers constituting the semiconductor package substrate and the chip may be caused.

SUMMARY OF THE INVENTION

The present invention has been made in an effort to provide a semiconductor package substrate capable of preventing a warping phenomenon caused due to a heat dissipation effect and the difference in a thermal expansion coefficient between layers when a semiconductor chip or a lead frame is mounted on the semiconductor package substrate.

Further, the present invention has been made in an effort to provide a semiconductor package substrate capable of preventing an internal crack generated by the difference in internal strain due to the difference in thermal expansion coefficient between layers of the semiconductor package substrate.

According to a preferred embodiment of the present invention, there is provided a semiconductor package substrate including: a base substrate; a mounting member mounted on an upper portion of the base substrate; and an adhesive layer formed between the base substrate and the mounting member, wherein the adhesive layer includes a thermally conductive adhesive and a ductile adhesive formed at the outer circumference of the thermally conductive adhesive.

The thermally conductive adhesive may be an adhesive including solder.

The ductile adhesive may be made of silicon or epoxy.

The semiconductor package substrate may further include a metal seed layer formed between the base substrate and the adhesive layer.

The metal seed layer may be formed on the entire surface of a lower portion of the adhesive layer.

The metal seed layer may be formed at a lower portion of the thermally conductive adhesive of the adhesive layer.

The metal seed layer may be made of copper.

The adhesive layer may further include an adhesive resist formed at the outer circumference of the ductile adhesive.

The adhesive resist may be made of a heat resistant resin.

The adhesive resist may be a solder resist.

The base substrate may be formed as a ceramic substrate or a metal substrate.

The mounting member may be a semiconductor chip or a lead frame.

BRIEF DESCRIPTION OF THE DRAWINGS

The patent or application file contains at least one drawing executed in color. Copies of this patent or patent publication with color drawing(s) will be provided by the U.S. Patent and Trademark Office upon request and payment of the necessary fee.

DESCRIPTION OF THE PREFERRED EMBODIMENTS

Figure 1:
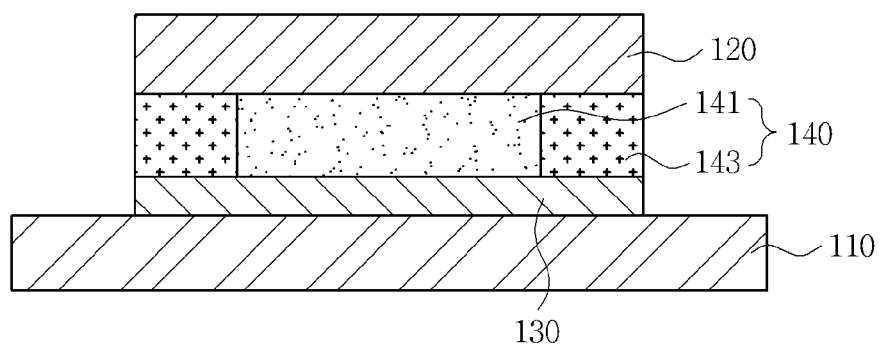
FIG. 1 is a sectional view showing the structure of a semiconductor package substrate according to an embodiment of the present invention.

Various features and advantages of the present invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings.

In the specification, in adding reference numerals to components throughout the drawings, it is to be noted that like reference numerals designate like components even though components are shown in different drawings. Terms used in the specification, 'first', 'second', etc. can be used to describe various components, but the components are not to be construed as being limited to the terms. The terms are only used to differentiate one component from other components.

One of the factors causing warpage of a semiconductor package substrate is the difference in thermal expansion coefficient between several layers constituting the semiconductor package substrate. Also, in some cases, a heat dissipation function of a chip depends on the types of chips mounted on the semiconductor package.

Thus, in a semiconductor package substrate according to an embodiment of the present invention, an adhesive layer bonding a mounting member and a base substrate includes both a thermally conductive adhesive and a ductile adhesive. Accordingly, a heat dissipation effect with respect to heat generated from chips can be achieved and a crack and warpage potentially occurring at the adhesive layer caused by the difference in thermal expansion coefficient between layers can be improved.

The semiconductor package substrate according to an embodiment of the present invention will now be described in detail with reference to the accompanying drawings.

FIG. 1 is a sectional view showing the structure of a semiconductor package substrate according to an embodiment of the present invention.

As shown in FIG. 1, the semiconductor package substrate 100 according to an embodiment of the present invention includes a base substrate 110, a mounting member 120, a metal seed layer 130, and an adhesive layer 140.

The base substrate 110 is a substrate on which the mounting member 120 is mounted. The base substrate 110 may be made of a heat conductive material to dissipate heat from the mounting member 120 mounted on the base substrate 110. For example, the base substrate 110 may be configured as a ceramic substrate or a metal substrate made of copper, gold, or the like. Here, the types of base substrates 110 are not limited to the metal substrate or the ceramic substrate, and any type of substrate can be used as the base substrate 110 so long as it is made of a heat conductive material having a heat dissipation effect with the mounting member 120.

The mounting member 120 is mounted on the base substrate 110, and it may be a semiconductor chip or a lead frame by way of example.

The metal seed layer 130, which serves to improve adhesive strength between the base substrate 110 and the adhesive layer 140, is formed on the base substrate 110. The metal seed layer 130 may be made of copper, nickel, chromium, molybdenum, tungsten, zinc, tin, silicon, palladium, titanium, or the like, alone or any combination thereof. According to an embodiment of the present invention, the metal seed layer 130 may be made of copper. The metal seed layer 130 may be deposited on the base substrate 110 through any one of vacuum deposition, physical deposition such as sputtering, and chemical vapor deposition.

The adhesive layer 140, which serves to bond the mounting member 120 to the base substrate 110, is formed between the metal seed layer 130 and the mounting member 120. According to an embodiment of the present invention, the adhesive layer 140 is comprised of a thermally conductive adhesive 141 and a ductile adhesive 143.

The thermally conductive adhesive 141 is formed at a central portion under the mounting member 120. For example, when the mounting member 120 is a semiconductor chip, the central portion of the semiconductor chip where the thermally conductive adhesive 141 is formed may be a portion, in which a circuit area, such as a memory, or the like, where heat is concentrated generating high temperature. Namely, since the thermally conductive adhesive 141 is formed at the portion of the mounting member 120 where heat at high temperatures is generated, heat dissipation characteristics can be improved. According to an embodiment of the present invention, the thermally conductive adhesive 141 may be an adhesive including solder. However, the thermally conductive adhesive 141 may not be limited to the adhesive including solder and can be any adhesive configured to include a material having high heat conductivity.

The ductile adhesive 143 is formed at the outer circumference of the thermally conductive adhesive 141. Namely, the ductile adhesive 143 may be formed to surround the thermally conductive adhesive 141 under the mounting member 120. The ductile adhesive 143 serves to prevent a crack generated in the thermally conductive adhesive 141 and the semiconductor package substrate 100 from being warped due to the difference in thermal expansion coefficient between layers, when temperature is changed according to a process performed later. Thus, the ductile adhesive 143 may be made of a material having ductility higher than that of the thermally conductive adhesive 141. Since the ductile adhesive 143 is formed at the outer circumference of the thermally conductive adhesive 141, a crack such as exfoliation, or the like, grown in the interior of the adhesive layer 140 or grown from the exterior to the interior between the metal seed layer 130 and the adhesive layer 140 can be prevented from being generated. According to an embodiment of the present invention, the ductile adhesive 143 may be an adhesive made of silicon or an adhesive made of an epoxy resin.

In this manner, the semiconductor package substrate 100 can obtain heat dissipation effect by using the heat conductive characteristics of the thermally conductive adhesive 141. Also, the semiconductor package substrate 100 can be prevented from being warped, caused by the difference in thermal expansion coefficient between layers, by the virtue of the ductile characteristics of the ductile adhesive 143. In addition, the semiconductor package substrate 100 can be prevented from being cracked, otherwise due to the difference in internal strain between layers according to the difference in thermal expansion coefficient between layers, by virtue of the ductile adhesive 143. Thus, the semiconductor package substrate 100 according to an embodiment of the present invention can have high reliability during a high temperature process and a high temperature reliability test performed later.

Figure 2:
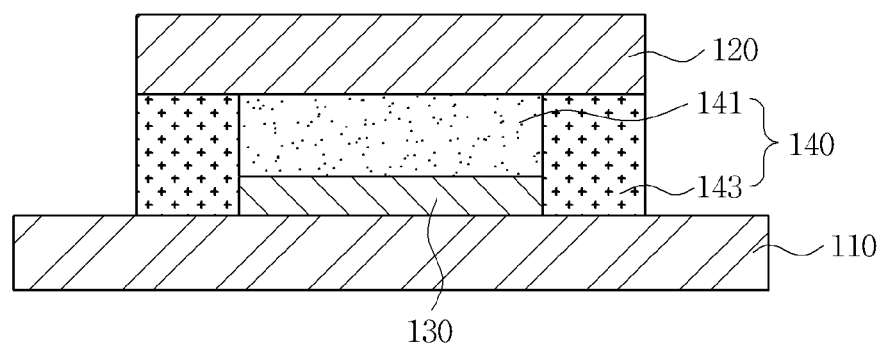
FIG. 2 is a sectional view showing the structure of a semiconductor package substrate according to another embodiment of the present invention.

FIG. 2 is a sectional view showing the structure of a semiconductor package substrate according to another embodiment of the present invention.

With reference to FIG. 2, the thermally conductive adhesive 141 of the adhesive layer 140 is formed between the metal seed layer 130 and the mounting member 120. Also, the ductile adhesive 143 of the adhesive layer 140 is formed between the base substrate 110 and the mounting member 120.

Here, the metal seed layer 130 may be formed to be positioned at a central portion of the mounting member 120, from which heat of high temperature is generated. In this manner, the thermally conductive adhesive layer 140 may be formed on the metal seed layer 130 formed to be positioned at the central portion of the mounting member 120.

The ductile adhesive 143 may be formed between the base substrate 110 and the mounting member 120 and surround both of the outer circumferences of the thermally conductive adhesive 141 and the metal seed layer 130. Since the adhesive layer 140 including the thermally conductive adhesive 141 and the ductile adhesive 143 is formed to have such a structure, heat dissipation characteristics with respect to heat of high temperature generated from the mounting member 120 can be improved and warpage and a crack otherwise caused due to the difference in thermal expansion coefficient between layers can be prevented.

Figure 3:
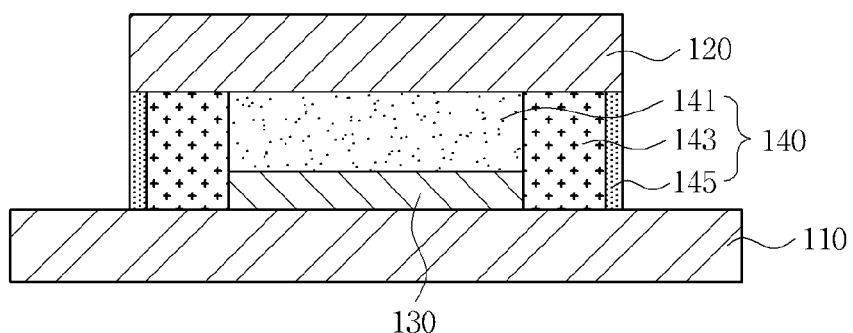
FIG. 3 is a sectional view showing the structure of a semiconductor package substrate according to another embodiment of the present invention.

FIG. 3 is a sectional view showing the structure of a semiconductor package substrate according to another embodiment of the present invention.

With reference to FIG. 3, the adhesive layer 140 may further include an adhesive resist 145.

The adhesive resist 145 according to an embodiment of the present invention may be formed at the outer circumference of the ductile adhesive 143. Since the adhesive resist 145 is formed at the outer circumference of the ductile adhesive 143, the ductile adhesive 143 can be prevented from being outwardly protruded compared with the mounting member 120 and from flowing due to wettability thereof with respect to the mounting member 120. As the adhesive resist 145 according to the characteristics of the present invention, a heat-resistant resin may be used. For example, the adhesive resist 145 may be formed as a solder resist including solder.

Figure 4:
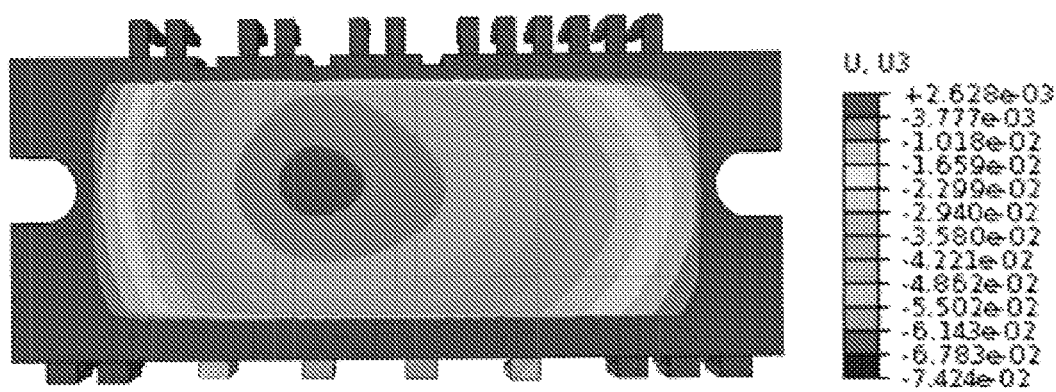
FIG. 4 is a perspective view showing an interpretation of a heat distortion structure with respect to the degree of warpage of the prior art semiconductor package substrate.

FIG. 4 is a perspective view showing an interpretation of a heat distortion structure with respect to the degree of warpage of the prior art semiconductor package substrate.

With reference to FIG. 4, it is noted that the prior art semiconductor package substrate is warped with a difference between a maximum height and a minimum height by about 77 μm.

Figure 5:
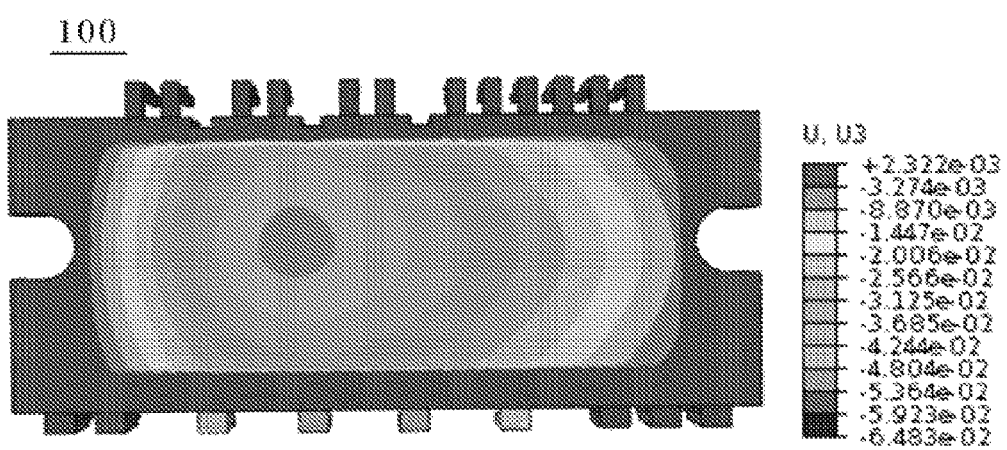
FIG. 5 is a perspective view showing an interpretation of a heat distortion structure with respect to the degree of warpage of the semiconductor package substrate according to an embodiment of the present invention.

FIG. 5 is a perspective view showing an interpretation of a heat distortion structure with respect to the degree of warpage of the semiconductor package substrate according to an embodiment of the present invention.

With reference to FIG. 5, it is noted that the semiconductor package substrate according to an embodiment of the present invention is warped with a difference between a maximum height and a minimum height by about 67 μm.

Namely, it is noted, in Table 1 shown below, that the degree of warpage of the semiconductor package substrate according to an embodiment of the present invention is improved by about 13% compared with the prior art semiconductor package substrate.

TABLE 1

|  | Prior art (μm) | Embodiment (μm) | Improvement rate (%) |
| --- | --- | --- | --- |
| Degree of warpage (maximum value − minimum value) | 77 | 67 | 13 |

The semiconductor package substrate according to an embodiment of the present invention has the advantage in that since the adhesive layer is formed to include a thermally conductive adhesive and a ductile adhesive, a heat dissipation effect and an effect of preventing warpage otherwise caused by the difference in thermal expansion coefficient between layers can be achieved.

The semiconductor package substrate according to an embodiment of the present invention has the advantage in that, since the adhesive layer includes the ductile adhesive, an internal crack otherwise caused by the difference in internal strain stemming from the difference in thermal expansion coefficient between layers can be prevented.

Although the preferred embodiments of the present invention have been disclosed for illustrative purposes, they are for specifically explaining the present invention and thus a semiconductor package substrate according to the present invention is not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A semiconductor package substrate, comprising:
   a base substrate;
   a lead frame mounted on an upper portion of the base substrate;
   an adhesive layer formed between the base substrate and the lead frame,
   wherein the adhesive layer includes a thermally conductive adhesive and a ductile adhesive formed at an outer circumference of the thermally conductive adhesive and wherein the adhesive layer further includes an adhesive resist formed at an outer circumference of the ductile adhesive.

2. The semiconductor package substrate as set forth in claim 1, wherein the thermally conductive adhesive is an adhesive including solder.

3. The semiconductor package substrate as set forth in claim 1, wherein the ductile adhesive is made of silicon or epoxy.

4. The semiconductor package substrate as set forth in claim 1, wherein the metal seed layer is formed on an entire surface of a lower portion of the adhesive layer.

5. The semiconductor package substrate as set forth in claim 1, wherein the metal seed layer is formed at a lower portion of the thermally conductive adhesive of the adhesive layer.

6. The semiconductor package substrate as set forth in claim 1, wherein the metal seed layer is made of copper.

7. The semiconductor package substrate as set forth in claim 1, wherein the adhesive resist is made of a heat-resistant resin.

8. The semiconductor package substrate as set forth in claim 1, wherein the adhesive resist is a solder resist.

9. The semiconductor package substrate as set forth in claim 1, wherein the base substrate is formed as a ceramic substrate or a metal substrate.

10. A semiconductor package substrate, comprising:
    a base substrate;
    a lead frame mounted on an upper portion of the base substrate; and
    an adhesive layer formed between the base substrate and the lead frame,
    wherein the adhesive layer includes a thermally conductive adhesive and a ductile adhesive formed at an outer circumference of the thermally conductive adhesive;
    wherein a metal seed layer is formed between the base substrate and the adhesive layer, the metal seed layer being a dummy pattern for improving adhesive strength between the base substrate and the adhesive layer; and
    the adhesive layer further includes an adhesive resist formed at an outer circumference of the ductile adhesive.

* * * * *